US009859419B1

United States Patent
Loechelt et al.

(10) Patent No.: US 9,859,419 B1
(45) Date of Patent: Jan. 2, 2018

(54) STACKED-GATE SUPER-JUNCTION MOSFET

(71) Applicant: SEMICONDUCTOR COMPONENTS INDUSTRIES, LLC, Phoenix, AZ (US)

(72) Inventors: Gary H. Loechelt, Tempe, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 51 days.

(21) Appl. No.: 15/224,835

(22) Filed: Aug. 1, 2016

Related U.S. Application Data

(63) Continuation of application No. 15/205,247, filed on Jul. 8, 2016, now Pat. No. 9,620,585.

(51) Int. Cl.
H01L 29/06 (2006.01)
H01L 29/78 (2006.01)
H01L 29/66 (2006.01)
H01L 29/36 (2006.01)
H01L 21/265 (2006.01)

(52) U.S. Cl.
CPC .... *H01L 29/7827* (2013.01); *H01L 21/26513* (2013.01); *H01L 29/0634* (2013.01); *H01L 29/36* (2013.01); *H01L 29/66666* (2013.01)

(58) Field of Classification Search
CPC .......... H01L 21/26513; H01L 29/0634; H01L 29/36; H01L 29/66666; H01L 29/7827
See application file for complete search history.

(56) References Cited

U.S. PATENT DOCUMENTS

| 6,215,168 | B1 | 4/2001 | Brush et al. |
| 6,677,626 | B1 | 1/2004 | Shindou et al. |
| 7,679,146 | B2 | 3/2010 | Tu et al. |
| 7,902,601 | B2 | 3/2011 | Loechelt et al. |

(Continued)

OTHER PUBLICATIONS

Y. Hattori et al., "Design of a 200V Super Junction MOSFET with n-buffer regions and its Fabrication by Trench Filling," Proceedings of 2004 International Symposium on Power Semiconductor Devices & ICs, Kitakyushu, pp. 189-192, 2004.

*Primary Examiner* — Bitew Dinke
(74) *Attorney, Agent, or Firm* — Iselin Law, PLLC

(57) ABSTRACT

A MOSFET having a stacked-gate super-junction design and novel termination structure. At least some illustrative embodiments of the device include a conductive (highly-doped with dopants of a first conductivity type) substrate with a lightly-doped epitaxial layer. The volume of the epitaxial layer is substantially filled with a charge compensation structure having vertical trenches forming intermediate mesas. The mesas are moderately doped via the trench sidewalls to have a second conductivity type, while the mesa tops are heavily-doped to have the first conductivity type. Sidewall layers are provided in the vertical trenches, the sidewall layers being a moderately-doped semiconductor of the first conductivity type. The shoulders of the sidewall layers are recessed below the mesa top to receive an overlying gate for controlling a channel between the mesa top and the sidewall layer. The mesa tops are coupled to a source electrode, while a drain electrode is provided on the back side of the substrate.

10 Claims, 6 Drawing Sheets

(56) References Cited

U.S. PATENT DOCUMENTS

| | | | |
|---|---|---|---|
| 2006/0289928 A1* | 12/2006 | Takaya | H01L 29/0623 |
| | | | 257/330 |
| 2007/0102773 A1* | 5/2007 | Hisatomi | H01L 29/063 |
| | | | 257/401 |
| 2007/0278565 A1* | 12/2007 | Tu | H01L 29/0634 |
| | | | 257/330 |
| 2009/0090967 A1* | 4/2009 | Chen | H01L 29/0634 |
| | | | 257/330 |
| 2009/0108342 A1* | 4/2009 | Wang | H01L 29/407 |
| | | | 257/330 |
| 2011/0079843 A1* | 4/2011 | Darwish | H01L 29/407 |
| | | | 257/331 |
| 2011/0272759 A1* | 11/2011 | Bol | H01L 29/0634 |
| | | | 257/330 |
| 2011/0316075 A1* | 12/2011 | Hsieh | H01L 29/66825 |
| | | | 257/330 |
| 2012/0074489 A1* | 3/2012 | Hsieh | H01L 29/7813 |
| | | | 257/330 |
| 2012/0187527 A1 | 7/2012 | Guitart et al. | |
| 2012/0326227 A1* | 12/2012 | Burke | H01L 29/407 |
| | | | 257/330 |
| 2013/0221428 A1* | 8/2013 | Venkatraman | H01L 29/7827 |
| | | | 257/330 |
| 2014/0103421 A1 | 4/2014 | Hossain et al. | |
| 2014/0103428 A1* | 4/2014 | Kim | H01L 29/0634 |
| | | | 257/330 |
| 2016/0284838 A1* | 9/2016 | Qin | H01L 29/7813 |

* cited by examiner

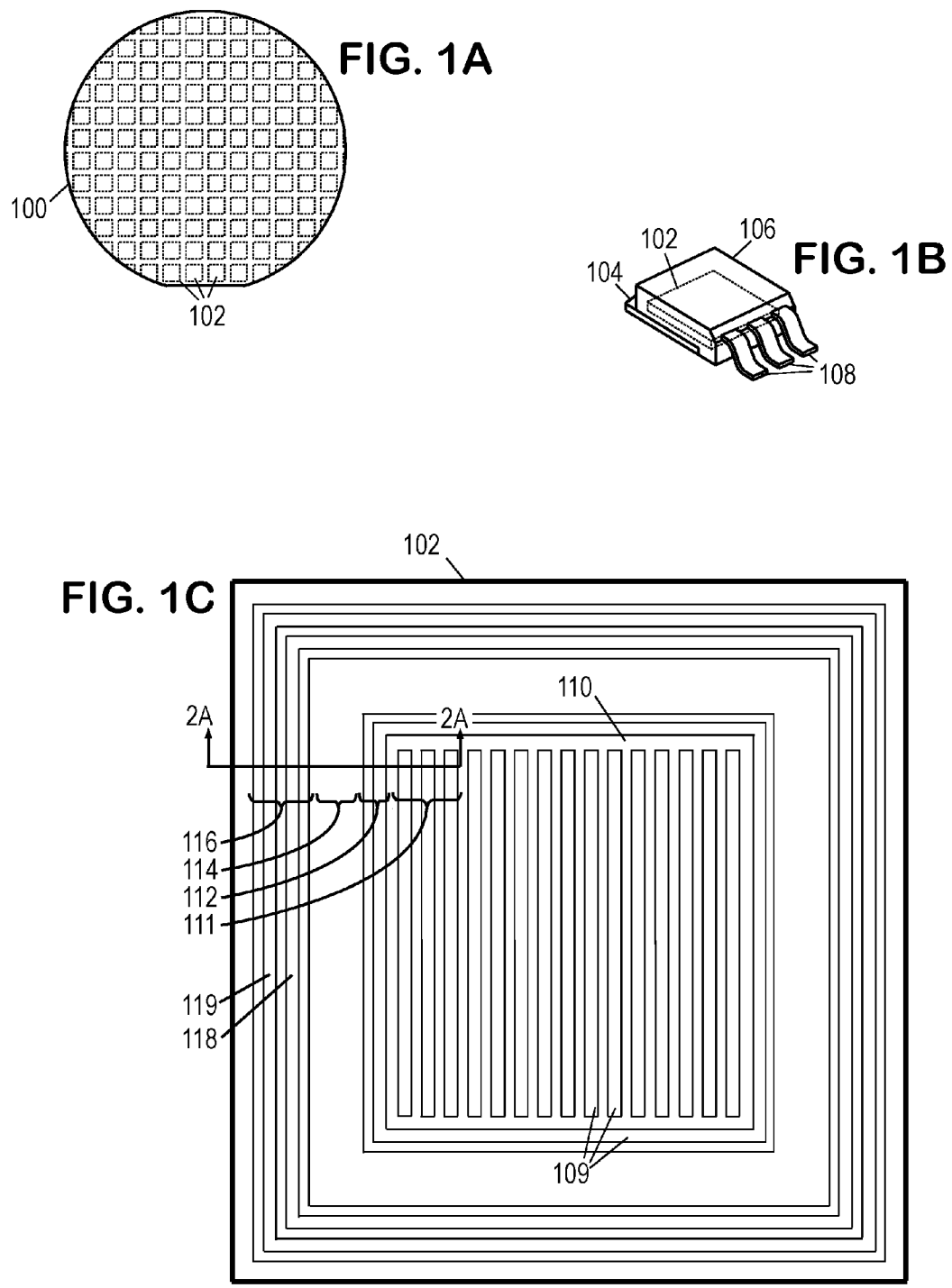

STACKED-GATE SUPER-JUNCTION MOSFET

BACKGROUND

Metal-oxide-semiconductor field effect transistors (MOSFETs) are semiconductor devices commonly employed for switching power on and off. A MOSFET includes a source region, a drain region, and a channel region extending between the source and drain regions. The channel region is separated from a gate electrode by a thin dielectric layer, so that a voltage applied to the gate electrode can control whether a conductive channel forms between the source and the drain regions. When the conductive channel is present, the MOSFET enables current to pass through the device, subject to an on-state resistance. When the conductive channel is absent, the device blocks current flow until such time as a breakdown voltage is reached.

It is desirable to make on-state resistance as small as possible while making the breakdown voltage as high as possible, but traditionally these parameters have had to be traded-off against each other. This trade-off constraint has been relaxed (though not eliminated) through the use of so-called "super-junction" devices. Such devices employ adjacent layers of oppositely-doped semiconductor to provide charge carriers for on-state conduction and depletion regions (equivalent to carrier-less "intrinsic" semiconductor material) for off-state current blocking.

Nevertheless, existing super-junction construction technologies suffer from a number of shortcomings, including limited device pitch (causing semiconductor volume to be wasted) and termination difficulty. The former shortcoming requires devices to be larger than necessary. The later shortcoming unnecessarily limits device reliability and yield.

SUMMARY

Accordingly, there is provided herein a MOSFET having a stacked-gate super-junction design and novel termination structure. At least some illustrative embodiments of the device include a conductive (highly-doped with dopants of a first conductivity type) semiconductor substrate with at least one lightly-doped or intrinsic epitaxial layer on its front side. The volume of the epitaxial layer is substantially filled with a charge compensation structure having one or more vertical trenches forming one or more intermediate mesas. The one or more mesas can be moderately doped via the trench sidewalls to have a second conductivity type, while the mesa tops are heavily-doped to have the first conductivity type. Sidewall layers are provided in the one or more vertical trenches, the sidewall layers being a moderately-doped semiconductor of the first conductivity type. The shoulders of the sidewall layers are recessed below the mesa top to receive an overlying gate for controlling a channel between the mesa top and the sidewall layer. The mesa tops are coupled to a source electrode and the gates are coupled to a gate electrode, while a drain electrode is provided on the back side of the substrate.

At least some illustrative embodiments of a manufacturing method include: (a) forming one or more vertical trenches in the epitaxial layer, thereby defining one or more intermediate mesas; (b) incorporating dopant atoms of the second conductivity type on sidewalls of the one or more vertical trenches; (c) diffusing the dopant atoms into the bulk of the one or more mesas; (d) forming a sidewall layer of the first conductivity type on the sidewalls of the one or more vertical trenches; (e) recessing edges of the sidewall layer below the front surface, thereby exposing a top of the one or more mesas in the one or more vertical trenches; (f) forming an insulating layer over the sidewall layer and the exposed top of the one or more mesas, the insulating layer bounding at least a portion of a recessed gate cavity; and (g) forming a conductive gate in the recessed gate cavity, the gate extending at least partly above the sidewall layer.

With reference to the termination structure, at least some illustrative embodiments of the device include the highly-doped semiconductor substrate of the first conductivity type having a first epitaxial layer lightly-doped to have the first conductivity type; and a second epitaxial layer lightly-doped to have the second conductivity type to form a vertical diode with the first epitaxial layer. A termination structure is provided near the outer edges of the device, the structure including a termination well in the second epitaxial layer, the termination well moderately-doped to have the first conductivity type so as to form a horizontal diode with the second epitaxial layer. The structure further includes an electric field barrier. The electric field barrier includes at least one vertical trench extending through the termination well into the first epitaxial layer and exposing a sidewall region. The sidewall region is doped via the sidewalls to be a moderately-doped semiconductor of the second type. Also provided are sidewall layers of a moderately-doped semiconductor of the first conductivity type, the sidewalls electrically coupling the termination well to the substrate.

At least some illustrative embodiments of a manufacturing method providing a termination structure include: (a) forming a termination well in or above a lightly-doped epitaxial layer of a first conductivity type, the termination well having a second conductivity type; (b) forming one or more vertical trenches extending through the termination well into the epitaxial layer; (c) forming an insulating layer inside the one or more vertical trenches. The trenches may be provided with a conductive fill material, which may in turn be ohmically connected to the termination well by, e.g., a drain seal ring. Alternatively, the trenches may be provided with an insulating fill material between sidewall layers of the second conductivity type to ohmically connect the termination well to the substrate.

Each of the foregoing embodiments may be implemented in combination and/or may include one or more of the following features in any combination: (1) the channel lies within a body well ohmically coupled to the source electrode. (2) the sidewall layers couple ohmically to the substrate via trench bottom implants of the first type. (3) an insulating trench fill between the sidewall layers in the one or more vertical trenches and below the overlying gate. (4) an insulating layer separating the gate from the mesa top, the channel, and the sidewall layer. (5) the channel extends vertically and horizontally beneath the insulating layer. (6) the substrate and at least one epitaxial layer comprise silicon. (7) the first conductivity type is n-type and the second conductivity type is p-type. (8) the first conductivity type is p-type and the second conductivity type is n-type. (9) the at least one epitaxial layer comprises two lightly-doped layers having an intermediate p-n interface that hinders vertical current flow around the charge compensation structure. (10) The method includes removing material from a bottom of the one or more vertical trenches before forming the sidewall layer. (11) The method includes, after removing said material, implanting dopant atoms of the second conductivity type into the bottom of the one or more vertical trenches, the implanted dopant atoms forming a conductive bridge between the substrate and the sidewall layer. (12) The method includes creating the recessed gate cavity before forming said conductive gate. (13) creating the recessed gate cavity include: (i) filling the one or more vertical trenches with a layer of insulating material, the insulating material leaving a depression over the one or more vertical trenches; (ii) forming a trench lid in said depression; and (iii) performing an etch of the insulating material to undercut the trench lid. (14) The method includes, after forming the conductive gate: (i) forming a self-aligned body well having the first conductivity type; (ii) forming, above the body well, a self-aligned source contact region having the second conductivity type; and (iii) recessing an upper surface of the conductive gate below the front surface. (15) The method includes: (i) forming an interlayer dielectric over the front surface; (ii) etching contact zones through the interlayer dielectric; and (iii) filling the contact zones to create at least a gate electrode and a source electrode. (16) incorporating the dopant atoms of the first conductivity type comprises one or more of: depositing a dopant material, forming an epitaxial layer of doped semiconductor material, or ion implantation. (17) an interlayer dielectric over the second or topmost epitaxial layer. (18) a drain seal ring over the interlayer dielectric above the electric field barrier, wherein the drain seal ring connects to the conductive trench fill material. (19) a gate recessed into the insulating trench fill material. (20) a drain seal ring over the interlayer dielectric above the electric field barrier, wherein the drain seal ring connects to the gate. (21) the edge termination structure comprises a physical barrier around the electric field barrier. (22) the physical barrier includes: (i) a second vertical trench extending through the termination well into the first epitaxial layer and exposing a sidewall region, the sidewall region being doped via trench sidewalls to be a moderately-doped semiconductor of the second type; (ii) sidewall layers in the second vertical trench, the sidewall layers comprising a moderately-doped semiconductor of the first type that electrically couples the termination well to the substrate; and (iii) a trench fill layer between the sidewall layers. (23) the trench fill layer comprises silicon dioxide or other dielectric or combination of silicon dioxide and other dielectrics. (24) the trench fill layer comprises epitaxial silicon. (25) the edge termination structure comprises a current barrier enclosed by the electric field barrier, the current barrier including: (i) a third vertical trench extending from a surface of the second epitaxial layer down into the first epitaxial layer and exposing a sidewall region, the sidewall region being doped via trench sidewalls to be a moderately-doped semiconductor of the second type; (ii) sidewall layers in the third vertical trench, the sidewall layers comprising a moderately-doped semiconductor of the first type and that electrically couple to the substrate; and (iii) an insulating trench fill layer between the sidewall layers. (26) the one or more vertical trenches extend through the epitaxial layer to contact the substrate. (27) The method includes forming a conductive trench fill layer on the insulating layer to serve as a electric field barrier. (28) The method includes: (i) forming an ohmic contact with the termination well; and (ii) forming a drain seal ring that electrically connects the termination well to the conductive trench fill layer. (29) the one or more vertical trenches includes two vertical trenches defining an intermediate mesa with a portion of the termination well, and said drain seal ring connects the conductive trench fill layers of the two vertical trenches to said portion of said termination well. (30) The method includes, before forming the insulating layer, forming a sidewall layer of the second conductivity type on the sidewalls of the one or more vertical trenches, wherein the sidewall layers ohmically couple the termination well to the substrate. (31) The method includes forming a drain seal ring that ohmically connects to the termination well. (32) the one or more vertical trenches includes two vertical trenches defining an intermediate mesa with a portion of the termination well, and wherein said drain seal ring ohmically connects to said portion of said termination well.

BRIEF DESCRIPTION OF THE DRAWINGS

In the drawings:

FIG. 1A is an illustrative patterned semiconductor wafer.

FIG. 1B is an illustrative packaged semiconductor device.

FIG. 1C is an illustrative semiconductor die.

Figure 2A:
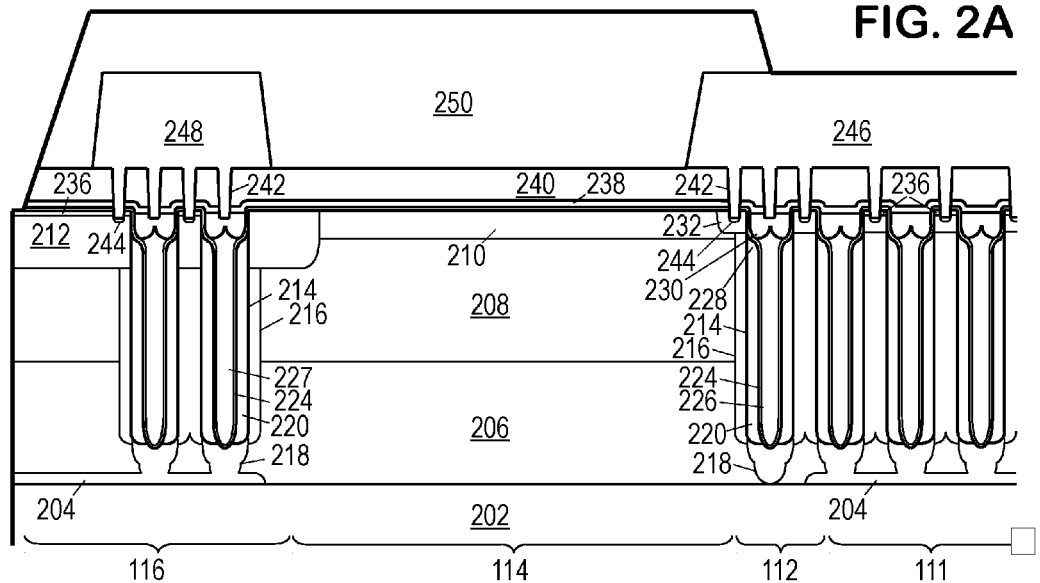
FIGS. 2A-2B are cross-sectional views of an illustrative medium-voltage power MOSFET.
Figure 2B:
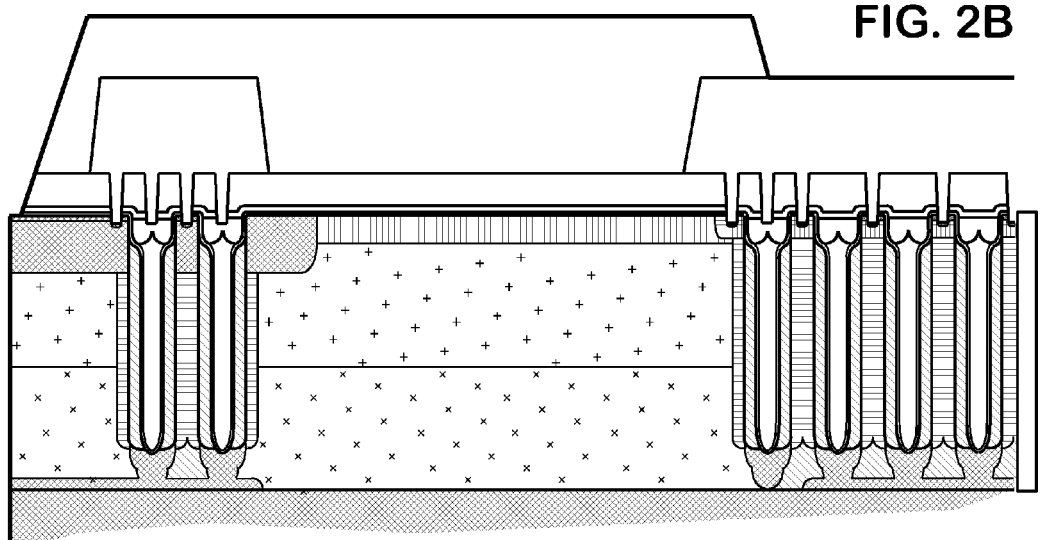

It should be understood that the drawings and corresponding detailed description do not limit the disclosure, but on the contrary, they provide the foundation for understanding all modifications, equivalents, and alternatives falling within the scope of the appended claims.

TERMINOLOGY

In the following description, the terms "intrinsic", "lightly-doped", "moderately-doped", and "heavily-doped", and "degenerate" are employed to indicate relative degrees of doping. These terms are not intended to indicate definitive numerical ranges, but rather to indicate (on a logarithmic scale) approximate ranges whose upper and lower extremes may be allowed to vary by a factor of 4 in either direction. In the context of silicon, the term "intrinsic" indicates a dopant concentration of $10^{14}$ atoms/cm$^3$ or less. "Lightly-doped" indicates a concentration in the range between $10^{14}$ and $10^{16}$ atoms/cm$^3$. "Moderately-doped" indicates a concentration in the range $10^{16}$ to $10^{18}$ atoms/cm$^3$, inclusive. "Heavily-doped" indicates a concentration in the range $10^{18}$ to $10^{20}$ atoms/cm$^3$. "Degenerate" indicates a doping level sufficient to provide an ohmic (non-rectifying) connection with a metal contact (generally greater than $10^{20}$ atoms/cm$^3$). Note that for semiconductors other than silicon, these ranges may vary.

DETAILED DESCRIPTION

The manufacturing of semiconductor devices begins with a wafer cut from a semiconductor crystal. The wafer serves as a substrate 100 to which a sequence of operations are applied. The operations in the sequence are generally well understood and documented in the open literature, and may include cleaning, etching, deposition, masking, implantation, diffusion, oxidation, metallization, and passivation. The precise order (and parameters) of the operations and patterning of the masks determine the structure of the resulting semiconductor device. As each device typically occupies only a small portion (a block or "die") of the substrate 100, the operations may be designed to create many semiconductor devices 102 at the same time, as shown in FIG. 1A. Once the sequence of processing operations is complete, the individual semiconductor devices 102 may be tested and cut apart ("singulated").

The singulation process applies highly-localized stresses that leave residual damage along the edges of each die. Such damage unpredictably impacts the electronic properties in its vicinity and generally accelerates chemical and physical forms of degradation. To prevent such damage from affecting operation of the semiconductor devices, device designers restrict the active area of the device to the interior of the die surrounded by scribe lanes that allow for saw kerf and buffer zones. Where buffer zones are insufficient to protect the device performance from edge damage, designers must provide the active area with some form of termination that shields it.

To make the individual semiconductor devices 102 even more robust, as well as making them easier to incorporate into electronic circuits, each device may be packaged. FIG. 1B shows an illustrative power MOSFET device 102 mounted on a thermally and electrically conductive tab 104, which is part of the external shell for packaged device 106. The packaged device 106 further includes leads 108 which may be soldered to terminals in an electronic circuit. In addition to providing a thermal pathway for drawing heat from the die, tab 104 may serve as an additional lead for connecting to the electronic circuit.

In accordance with the present disclosure, the individual semiconductor devices 102 may be stacked-gate superjunction MOSFETs, suitable for high-current, and moderate to high voltage applications in a compact form factor. The backside of the die may serve as a drain electrode (e.g., attached to conductive tab 104). FIG. 1C shows an illustrative front side of the die, with metallization and passivation layers omitted for illustrative purposes. In the illustrated embodiment, mesas or "pillars" 110 are defined by an array of trenches 109 in the device's active area 111. Alternatively, an area-filling cellular structure, such as squares or hexagons, may be used to provide the active area of the device with the desired electronic structures.

Note that for explanatory purposes, the figures are drawn with an exaggerated feature size. In at least some contemplated embodiments, the combined width of a mesa and trench are on the order of 3 micrometers, while the die may be approximately 10 millimeters across. Thus it may be expected to have roughly 3000 parallel trench stripes in practice, while the illustrated device has only 15.

A line 2A indicates the region of the cross-sectional views shown in FIGS. 2A-3G. The cross-sectional view includes a portion of the active region 111, a current barrier 112, a periphery 114, and a termination region 116 including a field barrier 118 and a physical barrier 119. In FIG. 2A, the termination region 116 is shown on the left and the active region 111 is shown on the right. The illustrated structure includes a semiconductor substrate 202, a buried layer 204, a first and second epitaxial layers 206, 208, a blanket implant 210, a termination well 212, trenches 214, charge compensation layers 216, trench bottom implants 218, super-junction layers 220, a trench liner 224, an active trench fill 226, a termination trench fill 227, drain regions 228, gates 230, a body well 232, source implants 236, a seal layer 238, an interlayer dielectric 240, contact zones 242, body contact implants 244, a source electrode 246, a drain seal ring 248, and a passivation layer 250. (A gate electrode would also be included, but is not shown here.) The comparative doping of the various regions is shown by cross-hatching in FIG. 2B for an power N-MOSFET embodiment.

Taking each of these elements in turn, we begin with semiconductor substrate 202. A suitable substrate is n-type silicon with crystallographic orientation <100> or <110>, heavily doped to minimize resistivity into the 1 to 3 milliohm-cm range. Arsenic doping at $2.4 \times 10^{19}$ atoms/cm$^3$ yields a resistivity of 2.8 milliohm-cm.

Buried layer 204 is optional, but may ensure the breakdown voltage of the termination region remains higher than that of the active region. Where it is desired, an epitaxially-grown buffer layer may be grown, in some embodiments, as 2.4 μm of lightly-doped n-type silicon, e.g., $4 \times 10^{15}$ arsenic atoms/cm$^3$, over which an oxide layer (i.e., silicon dioxide) is formed and a photoresist layer provided for masking. (The buried layer may be used in both the active region 111 and termination region 116, but can be omitted from the periphery 114 to enhance it voltage blocking capability.) Ion implantation may be used to implant $2 \times 10^{14}$ arsenic ions/cm$^2$ in the regions of the buffer layer where a buried region is desired. A suitable implantation energy is 60 keV at 0° tilt. An annealing step is included to repair the crystalline structure and diffuse the dopants.

Any oxides are stripped before epitaxial layers 206, 208 are grown, preferably with low dopant concentrations. In at least some embodiments, layer 206 may be 4 to 6 μm of lightly-doped n-type silicon, e.g., $2 \times 10^{15}$ phosphorus atoms/cm$^3$, while layer 208 may be 4.6 to 6.4 μm of lightly-doped p-type silicon, e.g., $2 \times 10^{15}$ boron atoms/cm$^3$. (Layer 208 may include a bit of extra height to allow for the transistor body. Similarly, layer 206 may include a bit of extra height to allow for dopant up-diffusion from the substrate after thermal processing.) These layers thereby create a vertical diode in the bulk of the device, which aids in controlling electrical fields in the termination region, as explained below. The layer thicknesses above are suitable for a transistor with a breakdown voltage of around 200 Volts. Commensurately thinner or thicker epitaxial layers would be used to achieve a device with a different breakdown voltage, and such variations are included within the scope of the appended claims. In other embodiments, a single layer of intrinsic (undoped) or lightly doped silicon of either conductivity type may be used in place of layers 206 and 208.

Though the use of undoped or lightly-doped epitaxial layers offers greater control of doping profiles for the active device area, and more specifically, enables significantly improved charge balancing in the superjunction, it is nevertheless possible to replace these layers with a moderately doped epitaxial layer that operates in the role of the charge compensation layers 216 (described further below). This approach offers certain advantages for manufacturing the device's active area, but presents challenges that may require changes to the periphery of the device to terminate the more heavily doped epitaxial layer. Further although layers 206 and 208 are displayed as single dopant density films, these films may alternatively have a graded doping profile to assist with the charge balance control within the active device structure 111.

A screen oxide may be grown before blanket implant 210 is formed. Ion implantation may be used to implant $1 \times 10^{12}$ boron ions/cm$^2$. A suitable implantation energy is 250 keV at 0° tilt. The blanket implant is provided to aid in charge-balancing a lateral diode that will be formed with the termination well 212.

A mask is used to pattern the termination well 212, limiting it to the edges of the die. Termination well 212 may be formed with ion implantation of an n-type dopant, such as $3.4 \times 10^{12}$ phosphorus ions/cm$^2$. A suitable implantation energy is 250 keV at 0° tilt. The termination well 212 forms a charge-balanced lateral diode with the blanket implant layer 210, operating to reduce the electric field at the surface of this region.

Figure 3A:
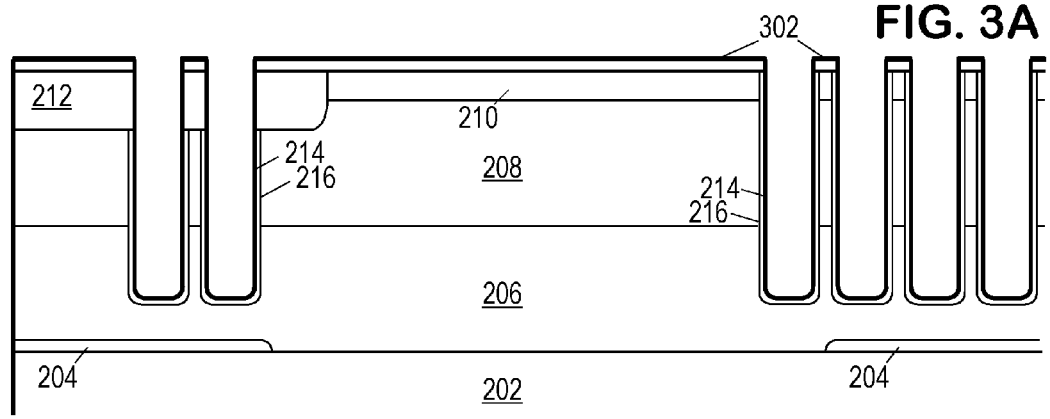
FIGS. 3A-3G are cross-sectional views at different stages in the manufacture of an illustrative device.

These implantations may be followed by an oxidation & annealing step preliminary to the formation of a "hard" oxide mask 302 (FIG. 3A). A thick oxide (e.g., 0.3-0.8 µm) is formed and the temperature elevated to a degree sufficient for densifying the oxide, annealing the silicon material damaged by the implantation process, and diffusing the dopants towards their desired depth.

To form trenches 214, a photoresist layer is deposited and patterned to form a mask 302. In some contemplated embodiments, the mask provides for a trench width of 1.8 to 2.4 µm and center-to-center separation of 3.2 to 4.0 µm. (These parameter values may vary with the desired operating characteristics of the device. In particular, center-to-center spacings as small as 2.6 µm are contemplated.) A dry oxide etch is applied to expose the silicon through the holes in the mask 302. A deep silicon etch is then performed to create the trenches 214. The trenches 214 should extend most of the way through the epitaxial layers 206, 208, leaving only a small gap between the trench bottoms and the substrate 202. Illustrative gap sizes are 1-2 µm. The trench sidewalls may then be smoothed through the growth and removal of a sacrificial oxide layer.

In at least some embodiments, charge compensation layers 216 are formed via ion implantation. A screen oxide may be grown, then ion implantation performed to seed the dopants for the charge compensation layers. In one embodiment, $1.55 \times 10^{13}$ boron ions/cm² are implanted at 35 keV with a 10° tilt angle (from four directions to minimize shadowing effects), resulting in sidewall concentration of $2.28 \times 10^{12}$ boron ions/cm² at approximately 6 keV. (FIG. 3A shows the device in this intermediate state, corresponding to the completion of blocks 502-508 in FIG. 5.) In subsequent thermal diffusion steps, these dopants will diffuse to create the charge compensation layers 216, preferably extending through the full volume of the pillars between adjacent trenches.

In continuing the implantation approach, a nitride or oxide layer is deposited over the screen oxide, then a spacer etch is performed to expose the silicon at the bottom of the trench while leaving the sidewalls protected by the nitride or oxide layer. A silicon recess etch may be performed to remove excess boron dopants from the bottom of the trench. An illustrative target depth for the silicon recess etch is 0.25 µm.

In certain contemplated embodiments, the charge compensation layers 216 are alternatively formed from an epitaxial layer of p-type silicon grown on the trench sidewalls, potentially with thin buffer layers of intrinsic silicon. A dry silicon etch may be applied to remove the p-type epitaxial layer from the trench bottoms and from the hard mask. As before, these dopants may be diffused with later thermal treatments to create charge compensation layers 216 that extend through the full volume of the pillars between adjacent trenches.

Figure 3B:
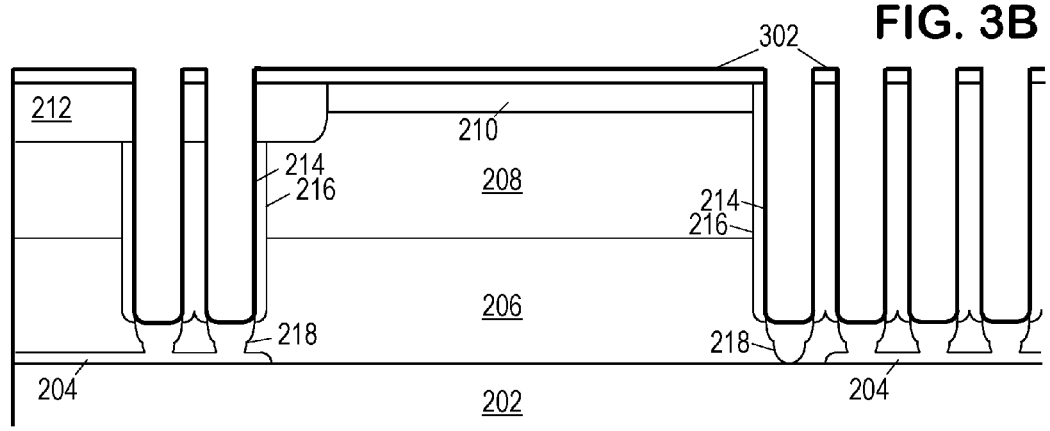

Trench bottom implants 218 are optional, but may be performed while the silicon is exposed at the bottoms of the trenches. A thin screen oxide may be formed before ion implantation is used to implant n-type dopants. In some embodiments, $1.2 \times 10^{14}$ arsenic ions/cm² may be implanted at 100 keV with a 0° tilt angle and $4.0 \times 10^{13}$ phosphorus ions/cm² may be implanted at 25 keV with a 0° tilt angle. Two dopant species are employed here to provide better control of the doping profile, with the phosphorus dopant providing faster diffusion while the arsenic dopant better resists out-diffusion during deposition of the super-junction layers 220. The trench bottom implants 218 bridge the gap to the substrate, enabling the super-junction layers to achieve a low-resistivity connection. (FIG. 3B shows the device in this intermediate state, corresponding to the completion of block 510 in FIG. 5.)

Figure 3C:
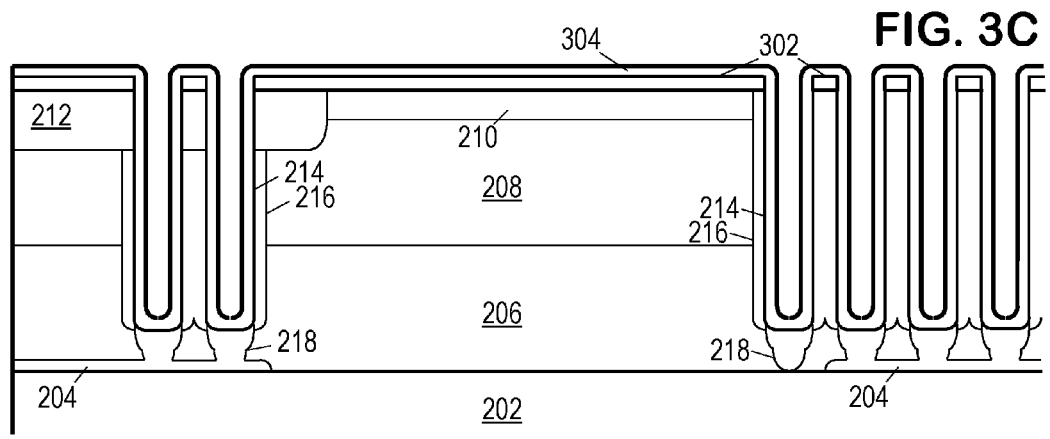

Super-junction layers 220 may be formed from a layer 304 (FIG. 3C) of epitaxially grown n-type silicon that couples to the trench sidewalls. In at least some embodiments, the epitaxial layer 304 has a thickness of 0.9 µm, which may include a buffer layer of 40-120 nm of intrinsic silicon, a core layer of 200-600 nm of n-type silicon (e.g., $2 \times 10^{16}$ to $4 \times 10^{16}$ phosphorus or arsenic atoms/cm³), and a liner layer of 200-600 nm of intrinsic or unintentionally-doped silicon. The layer thicknesses and dopings can be adjusted for optimal growth uniformity and rate. The buffer layer separates the n-type and p-type layers to reduce mutual counter-doping. The core layer is preferably as thick as possible to maximize electron mobility given the dimensions of the trench, but control of the doping concentration becomes increasingly difficult as the trench opening narrows. Use of intrinsic or unintentionally-doped silicon as a liner layer means that control of the layer's uniformity becomes less critical. (FIG. 3C shows the device in this intermediate state, corresponding to the completion of block 512 in FIG. 5.)

Figure 3D:
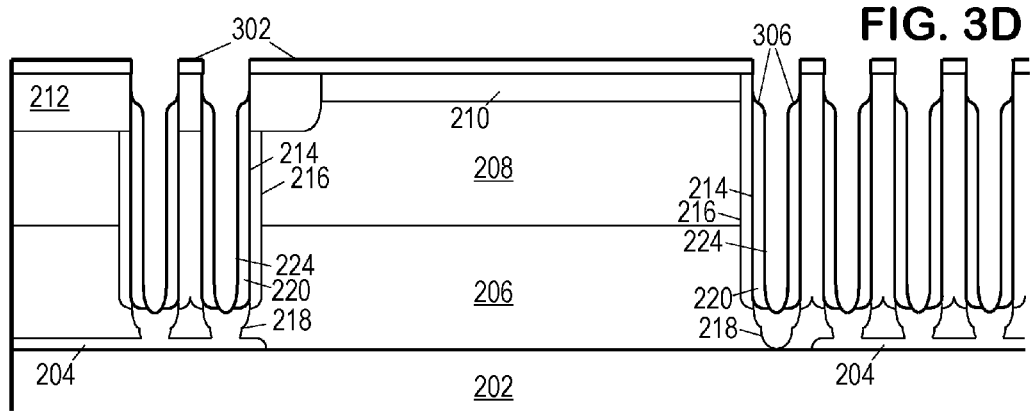

A silicon recess etch is applied to the device to remove the n-type silicon layer 304 from the surface, from the upper portions of the trench sidewalls, and potentially from the trench bottom. (Only the lower sidewall portions are left to form the super-junction layer 220. Thus the super-junction layer 220 may also be termed the sidewall layer.) This etch recesses the upper shoulder 306 (FIG. 3D) of the super-junction layer 220 below the surface of epitaxial layer 208 by 400-800 nm, but also removes the regions of the super-junction layer that are most likely to suffer defects during the epitaxial growth process. (FIG. 3D shows the device in this intermediate state, corresponding to partial completion of block 514 in FIG. 5.) An oxide wet strip operation removes the hard mask 302 from the device's upper surface. A sacrificial oxide layer may be grown and removed to smooth the surface of the silicon. The foregoing procedure thus produces a charge compensation structure having alternating charge-compensation and sidewall layers. The sidewall layers couple ohmically to the substrate, while the charge compensation layers will couple ohmically to the mesa tops.

Trench liner 224 is formed from an oxide layer of a suitable thickness for a gate oxide (e.g., 88 nm), protected by a nitride layer (e.g., 30 nm). The nitride layer will be used later to recover the appropriate thickness for the gate oxide. Alternately, the nitride layer can be skipped and the gate can be formed at a later point in the process flow. A filler material is then deposited to fill or encapsulate the residual volume of the trench. In the active region, the trench fill 226 is preferably an oxide or other dielectric, perhaps derived from an oxide precursor such as tetraethylorthosilicate (TEOS), and it may be created in multiple stages, e.g., an initial conformal TEOS deposition of 400 nm that leaves an air gap in the trenches, followed by a sputter etch (to smooth corners and edges of the oxide layer) and thermal treatment for oxide densification, followed by a second dielectric deposition of 200 nm to complete the trench fill 226. In the termination region, the trench fill 227 may also be formed from dielectric deposition in the same way to simplify processing. In at least some contemplated embodiments (not shown here), the termination trench fill 227 preferably consists of a conductive material such as metal or heavily doped polysilicon to provide better control of the electric field.

With the recessed shoulders 306, the filled trenches leave depressions on the surface, which are aligned with the filled trenches. These depressions may be filled with polysilicon or another suitable material for defining self-aligned gates. In at least some embodiments, a 1.2 μm layer of polysilicon is deposited over the surface. In an alternative "lidless" embodiment, the depressions are filled by oxide and no polysilicon is used.

Figure 3E:
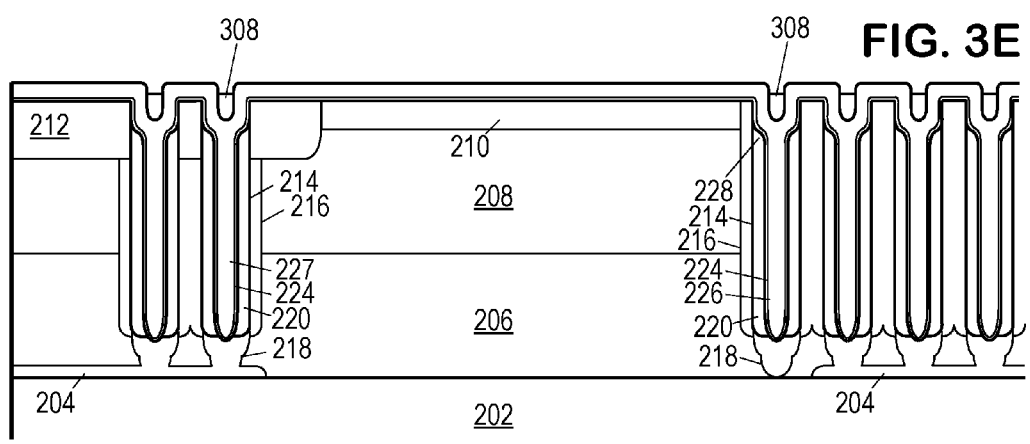

The device is then subject to a planarization process (e.g., chemical-mechanical planarization or "CMP") to remove the elevated portions of the polysilicon layer, leaving polysilicon only in the surface depressions. This residual polysilicon acts as a lid 308 (FIG. 3E) over the trench. With respect to the lidless embodiments, the oxide is also planarized. A polysilicon recess etch may then be applied to ensure the elevated portions of the oxide layer are adequately exposed for the next step. (FIG. 3E shows the device in this intermediate state, corresponding to completion of blocks 516-518.)

Figure 3F:
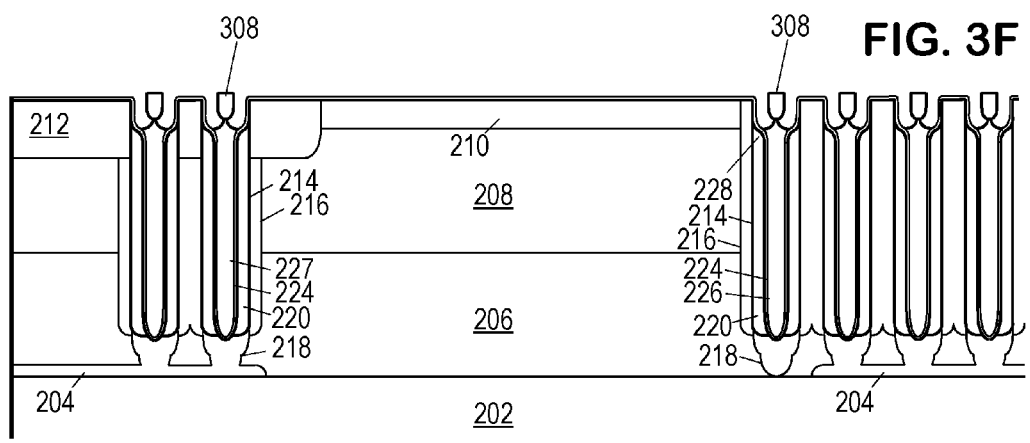

A wet oxide etch may be applied to remove the elevated portions of the oxide layer down to the protective nitride layer and, more importantly, to undercut the trench lids 308 to create a cavity for a recessed gate in the trenches. No undercut is needed for the lidless embodiments, as the oxide can be recessed directly from the surface instead. The cavity should be deep enough to ensure some overlap between the gate and the recessed shoulder 306, which will form the drain region 228. (FIG. 3F shows the device in this intermediate state, after completion of block 520.) Such overlap reduces channel pinch-off effects at elevated current levels.

The polysilicon lids 308 may optionally be retained as part of the gate, or they may be removed at this point with a polysilicon recess etch. A wet nitride strip is preferably used to remove the protective nitride layer from the exposed surfaces of the device, with a brief annealing step to cure any damage to the gate oxide.

Gates 230 are formed from a layer of polysilicon. In some embodiments, the layer is 800 nm of in situ doped phosphorus polysilicon. A CMP operation is applied to remove the elevated portions of the layer, leaving only the recessed portions as gates 230.

Body well 232 may be formed in the active and current barrier regions of the device by ion implantation. A photoresist layer may be deposited and patterned to protect the other regions of the device (i.e., the periphery and termination regions) before the ion implantation. In the active region, the gates 230 will screen the super-junction layers from the implantation. An illustrative implantation profile is $2.96 \times 10^{12}$ boron ions/cm$^2$ at 235 keV, $2.31 \times 10^{12}$ boron ions/cm$^2$ at 138 keV, $1.86 \times 10^{12}$ boron ions/cm$^2$ at 70 keV, and $1.62 \times 10^{12}$ boron ions/cm$^2$ at 30 keV, all at 0° tilt. The photoresist may be stripped and the device subjected to an annealing operation.

Source implants 236 may be formed in the device's active region by ion implantation. A photoresist layer may be deposited and patterned to expose the active region. As before, the gates 230 will screen the super-junction layers from the implantation. In some embodiments, the outer portion of the termination region may also be exposed. A suitable implantation profile is $5 \times 10^{15}$ arsenic ions/cm$^2$ at 130 keV with 0° tilt. The photoresist may be stripped and the device subjected to an annealing operation.

Figure 3G:
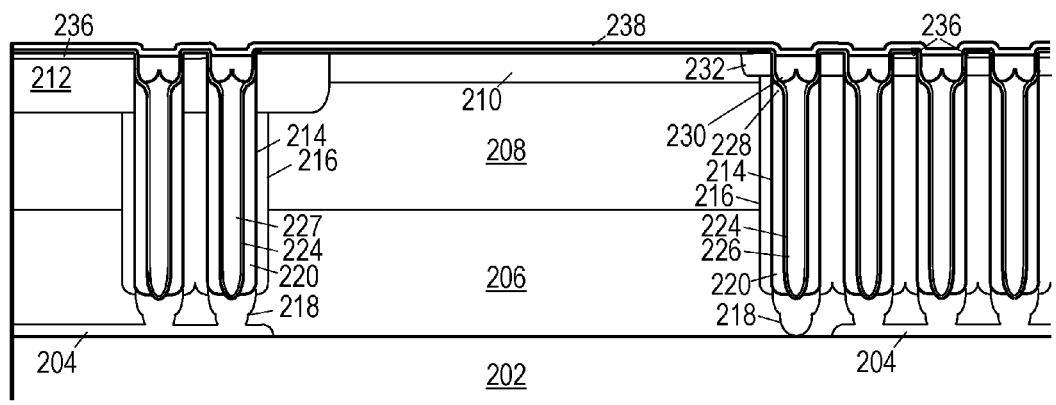

After the creation of the body well 232 and the source implants 236, a polysilicon recess etch may be used to remove the upper portion of the gates 230, making the gates recessed slightly (e.g., 100-200 nm) below the surface of the silicon. A seal layer 238 may then be provided to protect the semiconductive portions of the device. In some embodiments, the seal layer 238 includes 30 nm of oxide with a 100 nm nitride overlayer. (FIG. 3G shows the device in this intermediate state, corresponding to completion of blocks 522-528.) The seal layer is optional, and its function may be subsumed by the inter-layer dielectric 240.

In some embodiments, the inter-layer dielectric 240 is an 800 nm layer of phosphosilicate glass (PSG) or plasma enhanced tetraethylorthosilicate (PETEOS). A sputter etch or other planarization technique may be applied to smooth corners and edges on the upper surface of the dielectric 240. Over the interlayer dielectric, a photoresist layer is deposited and patterned to define contact zones 242. An etch process is used to remove the interlayer dielectric and any seal layer, thereby exposing the silicon or polysilicon gate material where it is desired to create electrical contacts. A dry silicon etch may be used to recess the silicon contact regions, preferably far enough to penetrate any source implants 236 within the contact zones 242.

Body contact implants 244 may be formed by ion implantation in the exposed silicon of the contact zones. To minimize dopant diffusion and keep the body contact implants shallow, the implantation profile may include $1 \times 10^{14}$ germanium ions/cm$^2$ at 60 keV, followed by $8 \times 10^{14}$ BF$_2$ ions/cm$^2$ at 9 keV. The photoresist may be stripped and an annealing operation applied. Any oxide formed by the annealing operation is removed before the metal contacts are formed. In at least some embodiments, the metal contacts are formed with thin layers of titanium and titanium nitride, which are annealed to form silicide where these layers contact the silicon. Thicker layers of tungsten (e.g., 500 nm) and aluminum (e.g., 4 μm) may be applied and patterned to form the source electrode 246, gate electrode (not shown), and drain seal ring 248. With suitable care in the design, the electrodes and seal ring can reside within a single metallization layer that is formed across the surface before being patterned via photoresist-guided etching.

In at least some embodiments, passivation layer 250 is a polyimide material. Similar to the metallization layer, it may be formed across the surface of the device and patterned via photoresist-guided curing. Portions of the electrodes are left exposed for connection to the external device leads 108. The reverse side of the device may then be provided with a drain electrode.

Figure 4:
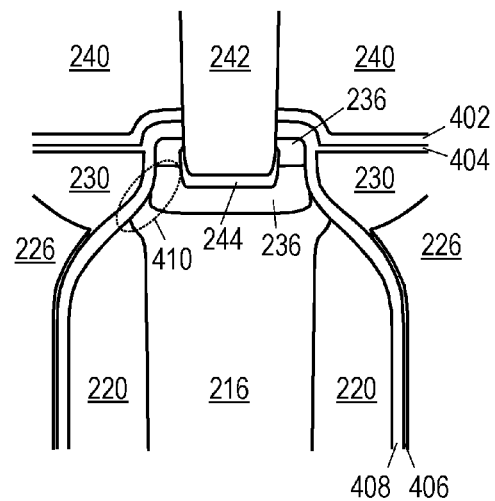
FIG. 4 is an enlarged view of a gate region.

FIG. 4 shows additional detail with an enlarged view of the device's source region. The (metal-filled) contact zone 242 extends through the interlayer dielectric 240, the seal layer 238 (shown here as a nitride layer 402 over an oxide layer 404), and the source implant 236 to reach body contact implant 244 within body well 236. (Though shown as having a definite boundary, body well 236 may be implemented having a diffuse gradient into the pillar. The trench liner 224 (shown here as a nitride layer 406 over an oxide layer 408) has its nitride portion removed from below the gate 230. The channel region 410 extends from the source implant 236 to the super-junction layer. The channel region 410 is angled to permit at least some portion of the gate to overlie the super-junction layer 220.

FIG. 4 represents the structure within the active device region 111 (FIG. 2A). Assuming the source electrode is coupled to ground, a positive voltage applied to the gate creates a conduction channel that supports drain-to-source current flow. With the heavily doped substrate, moderately-doped super-junction layer, and the heavily-doped source implant, the device minimizes resistivity along this vertical flow path from drain to source. When the gate voltage is below the threshold voltage, the conduction channel disappears. A drain-to-source voltage difference develops. The p-n interface between the super-junction layer 220 and the charge compensation layer 216 becomes reverse-biased, creating a depletion region that extends almost the full height of the epitaxial layers, enabling the device to withstand a large drain-to-source voltage without breaking down.

The termination structure of the device embodiment illustrated in FIGS. 1C and 2A includes a current barrier 112, a periphery 114, a field barrier 118, and a physical barrier 119. The current barrier 112 and physical barrier 119 are optional and may be omitted from some embodiments. The illustrated termination structure functions by minimizing the electric field along the edges of the die and along the surface outside the device's active region.

Within the current barrier region 112 (FIG. 2A), the source implants 236 are omitted. Moreover, the gate is maintained at the same potential as the body well, preventing the formation of a conduction channel and thereby inhibiting vertical current flow. Horizontal current flow is inhibited by the nonconductive trench fill 226.

In the periphery 114 the device is structured to provide horizontal and vertical p-n interfaces. The first epitaxial layer 206 is a lightly-doped n-type semiconductor, while the second epitaxial layer 208 is a lightly-doped p-type semiconductor, creating a p-n interface that blocks current flow in the vertical direction from the substrate towards the surface (a "vertical diode"). Moreover, the light doping of these layers enable a large voltage to be sustained without breaking down. Similarly, the termination well is n-type, creating a p-n interface with the second epitaxial layer 208 to resist current flow in the horizontal direction from the termination well to the periphery region (a "horizontal diode"). The blanket implant 210 provide sufficient doping for charge compensation with the termination well, and a sufficient horizontal dimension is provided to enable the device to sustain a large voltage between the termination region and the active region without breaking down.

In the termination region, the termination well (an n-type semiconductor) abuts against the super-junction layer 220 (also n-type), which extends via the trench-bottom implant 218 (n-type) to the substrate 202. In this fashion, a low-resistivity ring at drain potential is created around the periphery 114, in the form of a wall that extends from the substrate to the surface. In some contemplated embodiments, the drain potential of the ring may be further enhanced through the use of a conductive trench fill 227. This low-resistivity ring equalizes the potential along and outside of the field barrier 118. By minimizing the field outside this region, the termination structure minimizes the effects of any electronic property changes on the performance of the device.

Physical barrier 119 operates similarly to the field barrier, but additionally serves as an obstacle to fractures, migratory ions, and indeed any contaminants that might penetrate the die from its edges. The drain seal ring 248 also operates as a physical barrier above the silicon's surface, with the metal contacts functioning to resist cracking or separation of the superposed layers from the silicon.

Figure 5:
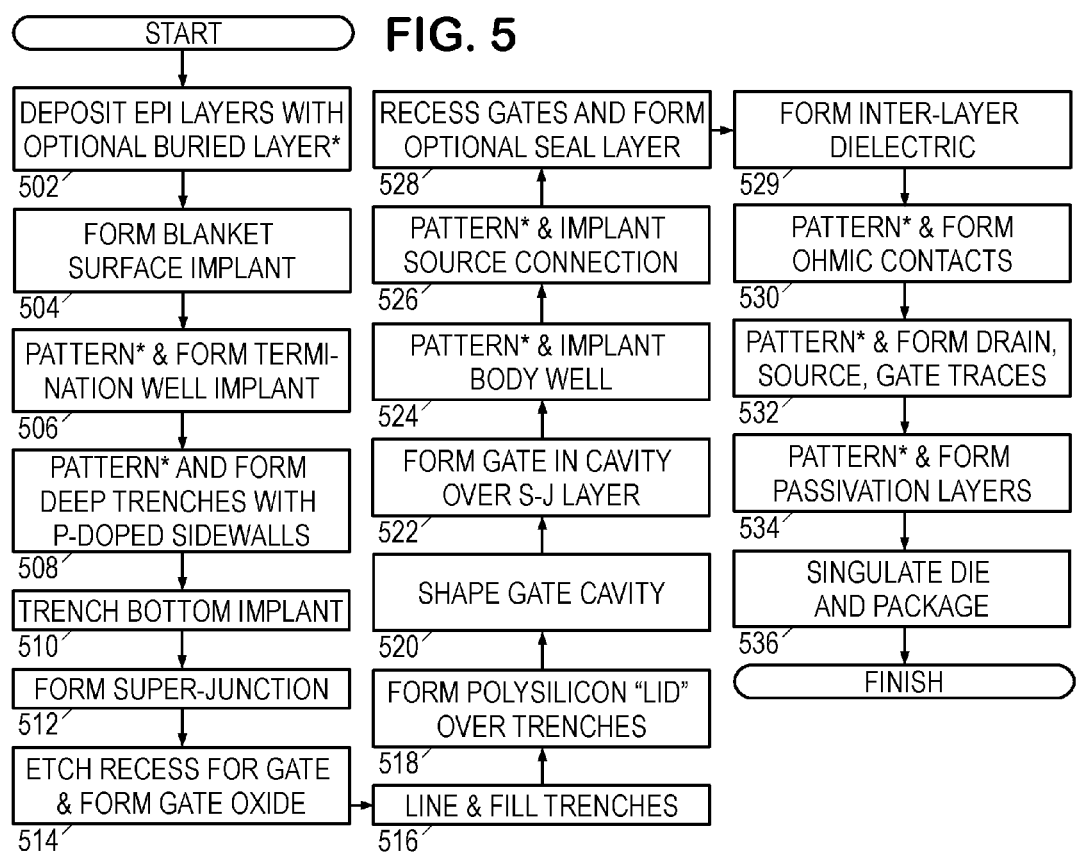
FIG. 5 is a flow diagram of an illustrative manufacturing method.

FIG. 5 summarizes an illustrative method for manufacturing the disclosed power MOSFETs having stacked-gate super-junctions. The method begins in block 502 with the deposition, on a heavily-doped n-type silicon substrate, an optional buffer layer, a first epitaxial layer, and a second epitaxial layer. The optional lightly-doped buffer layer may be used to create a buried n-type buried layer that underlies the active region 111 and the termination region 116. The first epitaxial layer is a lightly-doped n-type silicon, while the second epitaxial layer is a lightly-doped p-type silicon.

In block 504, a blanket layer of moderately-doped p-type silicon is implanted or deposited across the upper surface of the silicon. In block 506, a layer of photoresist is deposited and patterned to define the termination well, which is formed by implanting n-type dopants sufficient for moderate or heavy doping. The photoresist is stripped.

In block 508, another layer of photoresist is deposited and patterned to create an opening, which define the trenches. The trenches are then etched and provided with moderately-doped p-type sidewalls via implantation, diffusion, or deposition. These p-type sidewalls will form the charge compensation layer for the super-junction. After adequate diffusion, the charge compensation layer preferably extends through the entire region between adjacent trenches.

In block 510, the trench bottoms are etched to remove the excess p-dopant and implanted with n-type dopants sufficient to provide a heavily-doped bridge between the trench bottoms and the substrate. In block 512, an n-type super-junction layer is formed over the p-type sidewalls. In block 514, a recess etch is performed to recess the shoulders of the super-junction layers. A gate oxide may be formed at this stage.

In block 516, a nitride liner is formed and the trenches are filled with an oxide. The trench fill leaves surface depressions where trench lids are formed in block 518. In block 520 a wet oxide etch is used to remove trench fill from around the trench lids, thereby forming a cavity for the gate. The trench lid and nitride liner are preferably removed from the gate cavity. In block 522, a polysilicon gate is formed within the gate cavity. In this position, the gate sits vertically over at least a portion of the super-junction layer.

In block 524, a photoresist layer is deposited and patterned to define the active region of the device. The gates cooperate together with the patterned photoresist to define the body well. Sufficient p-type dopants are implanted to provide a moderately-doped p-type body well. The photoresist layer is stripped, and in block 526 a new photoresist layer is deposited and patterned to expose the termination region as well as the active region. The gates cooperate with the patterned photoresist to define the source connections. Implantation of n-type dopants is performed to provide a heavily-doped source connection. The photoresist layer is stripped.

In block 528 a recess etch is performed to recess the polysilicon gates below the surface of the silicon. In block 529, an interlayer dielectric is provided. In block 530, a photoresist layer is formed over the interlayer dielectric and patterned to define the contact zones, which are etched through the interlayer dielectric to reach the desired points in the silicon and polysilicon elements. P-type dopants are implanted at a sufficient dose to provide a degenerate semiconductor region for ohmic contact with the source and body.

In block 532, a metal layer is formed to fill the contact zones. The back side of the substrate may also be covered with a metal layer to form a drain electrode. On the front side, a photoresist layer is deposited and patterned, after which the metal layer may be etched to form the electrodes and traces for the drain seal ring, the gate electrode, and the source electrode. The photoresist is stripped.

In block 534, a passivation layer may be deposited, with an additional photoresist layer patterned to define the electrode contact regions. The exposed portions of the passivation layer are cured and the unexposed portions are stripped with the photoresist layer. A sintering operation may be performed to complete the processing of the wafer. In block 536, the dies are singulated and packaged to produce the finished power MOSFET.

The foregoing method can be automated and embodied in a conventional semiconductor processing system or assembly line.

While the foregoing description has focused on the manufacture of an N-MOSFET, a similar procedure with opposite dopant types may be employed to obtain a P-MOSFET. The dopants described above are preferred, but not essential. Other species of p-type and n-type dopants can be used. The foregoing description has also presumed the use of silicon as the semiconducting material, but one of ordinary skill will recognize that the foregoing approach may also be employed with other semiconducting materials such as carbon, germanium, and gallium-arsenide.

These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A semiconductor device that comprises:
   a substrate, the substrate being a heavily-doped semiconductor of a first type;
   at least one epitaxial layer on a front side of the substrate with a lower doping concentration than the substrate;
   a charge compensation structure substantially filling a volume of the epitaxial layer, the charge compensation structure comprising:
   one or more vertical trenches forming one or more intermediate mesas, the one or more intermediate mesas being a moderately-doped semiconductor of a second type, with each of the one or more intermediate mesas having a mesa top that is a heavily-doped semiconductor of the first type;
   a sidewall layer in the one or more vertical trenches, the sidewall layer comprising a moderately-doped semiconductor of the first type, wherein the sidewall layer is recessed lower than the mesa top to receive an overlying gate for controlling a channel between the mesa top and the sidewall layer, the gate overlapping at least a portion of the sidewall layer to extend the channel into the sidewall layer; and
   a drain electrode on a back side of the substrate;
   a source electrode that couples to the one or more mesa tops;
   a gate electrode coupled to the one or more overlying gates; and
   a thin insulating layer separating the overlying gate from the mesa top, the channel, and the sidewall layer, wherein the thin insulating layer and channel each extend vertically and horizontally beneath the gate,
   wherein "moderately-doped" indicates a dopant concentration between $10^{16}$ and $10^{18}$ atoms/cm$^3$, and "heavily-doped" indicates a higher dopant concentration between $10^{18}$ and $10^{20}$ atoms/cm$^3$.

2. The semiconductor device of claim 1, wherein the at least one epitaxial layer comprises a lightly-doped or intrinsic semiconductor, and the one or more intermediate mesas are more heavily doped than the epitaxial layer.

3. The semiconductor device of claim 1, wherein the channel lies within a body well ohmically coupled to the source electrode.

4. The semiconductor device of claim 1, wherein the sidewall layer couples ohmically to the substrate via trench bottom implants of the first type.

5. The semiconductor device of claim 1, further comprising an insulating trench fill between the sidewall layer in the one or more vertical trenches and below the overlying gate.

6. The semiconductor device of claim 1, wherein the channel is angled to provide said vertical and horizontal extent.

7. The semiconductor device of claim 1, wherein the substrate and at least one epitaxial layer comprise silicon.

8. The semiconductor device of claim 1, wherein said first type is n-type and said second type is p-type.

9. The semiconductor device of claim 1, wherein said first type is p-type and said second type is n-type.

10. The semiconductor device of claim 1, wherein the at least one epitaxial layer comprises two lightly-doped layers having an intermediate p-n interface that hinders vertical current flow around the charge compensation structure.

* * * * *